Nov. 29, 1960 R. L. BRIGHT 2,962,607

HYPERCONDUCTIVE CONTROL

Filed March 20, 1958

WITNESSES

John C. Healy, Jr.

Myron E. Click

INVENTOR

Richard L. Bright

BY

F. E. Browder

ATTORNEY

United States Patent Office 2,962,607
Patented Nov. 29, 1960

2,962,607

HYPERCONDUCTIVE CONTROL

Richard L. Bright, Hempfield Township, Westmoreland County, Pa., assignor to Westinghouse Electric Corporation, East Pittsburgh, Pa., a corporation of Pennsylvania Filed Mar. 20, 1958, Ser. No. 722,717
5 Claims. (Cl. 307—88.5)

Figure 1:
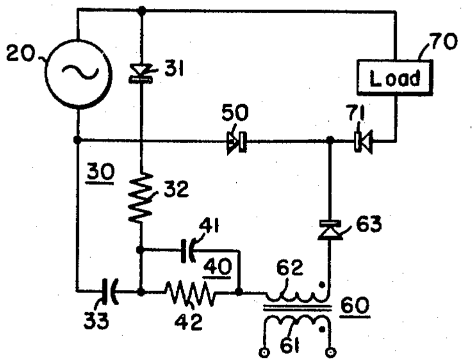

This invention relates to control apparatus in general and particularly to control apparatus having phase or pulsed controlling means.

The advent of a semiconductor diode having such characteristics that on exceeding certain specified reverse current and voltage, the diode becomes highly conductive and thereafter will carry a substantial reverse current at low voltages, has led to many new control applications. The phenomenon described above is not a Zener breakdown, nor is it an avalanche breakdown. This unique breakdown can be repeated indefinitely. This breakdown has been designated as hyperconductive breakdown, since the diode has an exceedingly high conductive or hyperconductive region in its reverse voltage-current characteristic. A diode having such a characteristic will be referred to hereinafter as a hyperconductive diode.

An example of such a hyperconductive diode with controllable reversible breakdown characteristics or hyperconductive breakdown may be constructed from the following elements. A first base element consists of a semiconductor member doped with an impurity to provide a first type of semiconductivity, either N or P. Upon this first base element, is an emitter element consisting of semiconductor material doped with the opposite type of semiconductivity. This emitter may be prepared by alloying a pellet containing a doped impurity to a wafer or semiconductor material forming the first base element. An emitter junction is present at the zone between the first base element and the emitter element.

In order to facilitate the connection of the diode into an electrical circuit, a layer of silver or other good conductor metal may be fused, alloyed into or soldered with the upper surface of the emitter element. Copper or other type lead wires may be readily soldered to this layer.

A second base of opposite conductivity is provided next to the first base element. A zone where the first and second base elements meet, forms a collector junction.

Next to the second base element is a mass-of-metal which is a source of carriers that play a critical part in the functioning of the diode. This mass-of-metal may be neutral or it may have the same doping characteristics as the second base. The mass-of-metal may be applied to the second base element by a soldering, alloying, fusing or other similar well-known method.

Such a hyperconductive diode is described in a copending application Serial No. 642,743, entitled "Semiconductor Diode," filed February 27, 1957, and assigned to the assignee of the present invention. For a more detailed description of the operation, characteristics, and construction of such a hyperconductive diode, reference is made to the above referenced copending application, Serial No. 642,743.

Another example of a hyperconductive diode device that performs in accordance with the requirements of this invention is described in "The Four Layer Diode," by Dr. William Shockley, in Electronic Industries and Tele Tech, August 1957, pages 58–60, 161–165.

It is an object of this invention to provide an improved control apparatus.

It is another object of this invention to provide an improved control apparatus which controls the amount of power delivered to a load from a source.

It is still another object of this invention to provide an improved control apparatus which controls the conduction of current and load and requires very little peak control power.

Further objects of this invention will become apparent from the following description when taken in conjunction with the accompanying drawing. In said drawing, for illustrative purposes only, is shown a preferred embodiment of the invention.

Figure 2:
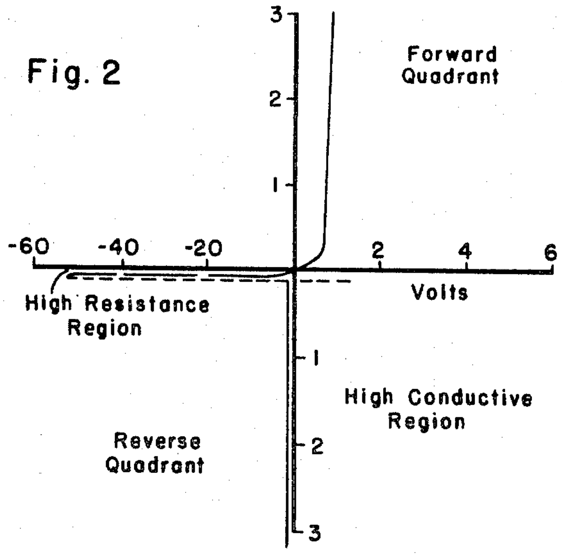

Figure 1 is a schematic diagram of a control circuit embodying the teachings of this invention; and Fig. 2 is a graphical representation of the operating characteristics of a hyperconductive semiconductor diode as utilized in the apparatus illustrated in Fig. 1.

Referring to Fig. 1 the control apparatus illustrated schematically, comprises in general, a source of power 20, an energy storing circuit 30, a peaking or triggering transformer 60, a hyperconductive diode 50 and a load 70.

The power source 20 is serially connected with the load 70, a half-wave rectifying means 71, and a hyperconductive diode means 50. The power source 20 is serially connected with the energy storage circuit 30 which comprises a serially connected rectifier means 31, a charging resistor 32, and a capacitive means 33. The power source 20 is shown as an alternating-current voltage source. However, it may be a half-wave direct current source if, the triggering pulse to be discussed hereinafter is phased properly to release the hyperconductive diode 50 at a time whenever the source 20 may deliver current to the load 70.

The capacitive means 33 is connected across the hyperconductive diode 50 through a current limiting resistor 42, a secondary winding 62 of the peaking transformer 60, and a isolating rectifier means 63. A capacitor 41 is to be connected across the current limiting resistor 42. A triggering or peaking pulse is to be applied to a primary winding 61 of the peaking transformer 60.

Referring now to Fig. 2, the curve shows how the hyperconductive semiconductor diode 50 responds to the application of different voltages. Considering the upper right or forward quadrant, when a forward voltage of the order of one voltage unit is applied, the current builds up to about three current units. When the voltage is reversed, it builds up in the reverse direction to about −55 volts with only a small fraction of a current unit flowing, and then the diode suddenly becomes highly conductive, that is, it conducts in the high conductive or hyperconductive region of its reverse voltage-current characteristic, and the voltage drops to about one voltage unit as shown in the lower left or reverse quadrant. In the hyperconductive region the diode then becomes a conductor with low ohmic resistance and the current builds up rapidly to several current units.

As shown in the reverse quadrant, when the diode breaks down, the voltage drops along a substantially straight line to approximately one voltage unit and very little power is dissipated in maintaining the diode highly conductive. The diode can be rendered highly resistant again by reducing the current below a minimum threshold value and the voltage below breakdown value. Consequently, the curve can be repeatedly followed as desired, by properly controlling the magnitude of reverse current and voltage.

Referring again to Fig. 1, the capacitive means 33 is charged to a predetermined value by the power source 20 through the rectifying means 31 and the charging resistor 32. The magnitude of the charge on the capacitive means 33 is never above the breakdown voltage of the hyperconductive diode 50, however, by design it will be just below the breakdown value. Whenever a trigger pulse, with polarity as shown in Fig. 1, is applied to the primary winding 61 of the peaking transformer 60, the voltage induced on the secondary winding 62 will, when added to the voltage stored across the capacitive means 33, be sufficient to break down the hyperconductive diode 50 and allow conduction of current through the load 70. The timing of the pulse applied to the primary 61 determines the portion of each half-cycle of power which is allowed to be applied to the load 70.

The filter network 40, comprising a paralleled capacitance 41 and a current limiting resistor 42, functions in the following manner. After the diode 50 breaks down, the breakdown circuit would essentially be short-circuited. Thus, the resistance 42 limits the current flow in the short-circuited circuit. However, to gain the full effectiveness of having a trigger pulse of only a small magnitude, the capacitance 41 is designed to have a small impedance and therefore will pass a trigger pulse of a higher frequency around the current limiting resistor 42.

The rectifier 63 functions to isolate the breakdown or triggering circuit from the load circuit. The rectifier 71 functions to maintain conduction through the load only whenever the hyperconductive diode 50 breaks down.

The circuit disclosed herein has the advantage of requiring very little peak control power. It accomplishes this by maintaining a direct current voltage across the hyperconductive diode 50 which is only a few volts less in the breakdown value. Thus, a control trigger pulse has only to supply the difference between the maintained direct current voltage and the breakdown voltage of the hyperconductive diode.

In conclusion, it is pointed out that while the illustrated example constitutes a practical embodiment of my invention, I do not limit myself to the exact details shown, since modification of the same may be varied without departing from the spirit and scope of this invention.

I claim as my invention:

1. In a control circuit, in combination; electrical energy storage means; diode means having a high conductive region in its reverse voltage-current characteristic at a very low voltage; trigger circuit means; and circuit means connecting said diode means to control the flow of current in a load circuit; said electrical energy storage means being connected in parallel circuit relationship with said diode means and means for supplying power to said control circuit; said trigger circuit being connected in parallel circuit relationship with said diode means to assist said electrical energy storage means in causing breakdown of said diode means and cause conduction in said high conductive region in its reverse voltage-current characteristic in response to a trigger pulse applied to said trigger circuit means.

2. In a control circuit, in combination; electrical energy storage means; semiconductor diode means having a high conductive region in its reverse voltage-current characteristic at a very low voltage; trigger circuit means; and circuit means connecting said semiconductor diode means to control the flow of current in a load circuit; said electrical energy storage means being connected in parallel circuit relationship with said semiconductor diode means and means for supplying power to said control circuit; said trigger circuit being connected in parallel circuit relationship with said semiconductor diode means to assist said electrical energy storage means in causing conduction of said semiconductor diode means in said high conductive region of its reverse voltage-current characteristic in response to a trigger pulse applied to said trigger circuit means.

3. In a control circuit, in combination; electrical energy storage means; semiconductor diode means having a hyperconductive region in its reverse voltage-current characteristic at a very low voltage and having a controllable reversible breakdown characteristic in response to a predetermined magnitude of direct-current voltage applied thereacross; trigger circuit means; filter network means; means for isolating said trigger circuit from said load circuit; and circuit means connecting said semiconductor diode means to control the flow of current in a load circuit; said electrical energy storage means being connected in parallel circuit relationship with said semiconductor diode means and means for supplying power to said control circuit; said trigger circuit being connected in parallel circuit relationship with said semiconductor diode means to assist said electrical energy storage means in causing breakdown of said semiconductor diode means in said hyperconductive region in response to a trigger pulse applied to said trigger circuit means, said filter network means being serially connected with said trigger circuit and adapted to pass said trigger pulse while limiting current flow in said trigger circuit after breakdown of said semiconductor diode means.

4. In a control circuit, in combination; electrical energy storage means comprising capacitive means and circuit means for charging said capacitive means; semiconductor diode means having a hyperconductive region in its reverse voltage-current characteristic at a very low voltage and having a controllable reversible breakdown characteristic in response to a predetermined magnitude of direct-current voltage applied thereacross; trigger circuit means; filter network means; means for isolating said trigger circuit from said load circuit; and circuit means connecting said semiconductor diode means to control the flow of current in a load circuit having means for maintaining a unidirectional current flow in said load circuit, said electrical energy storage means being connected in parallel circuit relationship with said semiconductor diode means and means for supplying power to said control circuit; said trigger circuit being connected in parallel circuit relationship with said semiconductor diode means to assist said electrical energy storage means in causing breakdown of said semiconductor diode means in said hyperconductive region in response to a trigger pulse applied to said trigger circuit means, said filter network means being serially connected with said trigger circuit and adapted to pass said trigger pulse while limiting current flow in said trigger circuit after breakdown of said semiconductor diode means.

5. In a control circuit, in combination; electrical energy storage means comprising capacitive means and circuit means for charging said capacitive means; diode means having a hyperconductive region in its reverse voltage-current characteristic at a very low voltage, trigger circuit means comprising transformer means having a secondary winding serially connected with said capacitive means across said diode means; filter network means comprising a paralleled low impedance capacitive means and a resistance means; means for isolating said trigger circuit from said load circuit; and circuit means connecting said diode means to control the flow of current in a load circuit having means for maintaining a unidirectional current flow in said load circuit, said electrical energy storage means being connected in parallel circuit relationship with said diode means and means for supplying power to said control circuit; said trigger circuit being connected in parallel circuit relationship with said diode means to cooperate with said electrical energy storage means in causing breakdown of said diode means in said hyperconductive region in response to a trigger pulse applied to said trigger circuit means, said filter network means being serially connected with said trigger circuit means and adapted to pass said trigger pulse while limiting current flow in said trigger circuit after breakdown of said diode means.

References Cited in the file of this patent

UNITED STATES PATENTS

| | | |
|---|---|---|
| 2,644,893 | Gehman | July 7, 1953 |
| 2,737,601 | McMahon | Mar. 6, 1956 |
| 2,841,719 | Radcliffe | July 1, 1958 |
| 2,866,909 | Trousdale | Dec. 30, 1958 |
| 2,875,382 | Sandin | Feb. 24, 1959 |

FOREIGN PATENTS

| | | |
|---|---|---|
| 165,098 | Australia | Sept. 8, 1955 |

OTHER REFERENCES

"Negative Resistance in Germanium Diodes," by Kauke, in Radio-Electronic Engineering, April 1953, pages 8 to 10.